United States Patent [19]

Malhi

[11] Patent Number: 4,890,145
[45] Date of Patent: Dec. 26, 1989

[54] DRAM CELL AND ARRAY
[75] Inventor: Satwinder S. Malhi, Garland, Tex.
[73] Assignee: Texas Instruments Incorporated, Dallas, Tex.
[21] Appl. No.: 316,587
[22] Filed: Feb. 27, 1989

Related U.S. Application Data

[63] Continuation of Ser. No. 244,575, Sep. 13, 1988, abandoned, which is a continuation of Ser. No. 153,546, Feb. 9, 1988, abandoned, which is a continuation of Ser. No. 924,117, Oct. 30, 1986, abandoned, which is a continuation of Ser. No. 646,663, Aug. 31, 1984, abandoned.

[51] Int. Cl.$^4$ .................. H01L 29/78; H01L 27/02; H01L 29/06
[52] U.S. Cl. ............................. 357/23.6; 357/23.4; 357/23.12; 357/51; 357/55
[58] Field of Search ............ 357/23.4, 23.6, 23.12, 357/51, 55

[56] References Cited

U.S. PATENT DOCUMENTS

| | | | |
|---|---|---|---|
| 4,199,772 | 4/1980 | Natori et al. | 357/23 |
| 4,353,086 | 10/1982 | Jaccodine et al. | 357/51 |
| 4,396,930 | 8/1983 | Mizutani | 357/23 |
| 4,432,006 | 2/1984 | Takei | 357/23 |
| 4,462,040 | 7/1984 | Ho et al. | 357/23.6 |
| 4,549,927 | 10/1985 | Goth et al. | 357/55 |

FOREIGN PATENT DOCUMENTS

| | | | |
|---|---|---|---|
| 0088451 | 9/1983 | European Pat. Off. | 357/23.6 |
| 0108390 | 5/1984 | European Pat. Off. | 357/23 |
| 57-109367 | 8/1982 | Japan | 357/23.6 |
| 58-3269 | 1/1983 | Japan | 357/23.6 |
| 58-213464 | 12/1983 | Japan | 357/23.6 |
| 59-19366 | 1/1984 | Japan | 357/23 |
| 1084937 | 9/1967 | United Kingdom | 357/23.4 |

OTHER PUBLICATIONS

C. G. Jambothar, "Compact One-Device Dynamic RAM Cell With High Storage Capacitance", IBM Technical Disclosure Bulletin, vol. 27, No. 2 (Jul. 1984), pp. 1313–1320.

D. M. Kenney, "Reduced Bit Line Capacitance in VMOS Devices", IBM Technical Disclosure Bulletin, vol. 23 (1981), pp. 4052–4053.

D. M. Kenney, "V–Groove Dynamic Memory Cell", IBM Technical Disclosure Bulletin, vol. 23 (1980), pp. 967–969.

T. S. Chang et al, "Vertical FET Rancom–Access Memories with Deep Trench Isolation", IBM Technical Disclosure Bulletin, vol. 22 (1980), pp. 3683–3687.

H. S. Lee et al, "Short–Channel Field–Effect Transistors in V–Grooves", IBM Technical Disclosure Bulletin, vol. 22 (1980), pp. 3630–3634.

J. J. Fatula, Jr. et al, "N Skin Elimination in UMOS Device by Re–Oxidation", IBM Technical Disclosure Bulletin, vol. 22 (1980), pp. 3204–3205.

T. S. Chang et al, "Fabrication of V–MOS or U–MOS Random–Access Memory Cells With a Self–Aligned Word Line", IBM Technical Disclosure Bulletin, vol. 22 (1979), pp. 2768–2771.

F. Barson, "Dynamic DMOS Random–Access Memory Cell Design with Trench", IBM Technical Disclosure Bulletin, vol. 21 (1978), pp. 2755–2756.

Primary Examiner—J. Carroll
Attorney, Agent, or Firm—Douglas A. Sorensen; James T. Comfort; Melvin Sharp

[57] ABSTRACT

A dRAM cell and array of cells, together with a method of fabrication, are disclosed wherein the cell includes one field effect transistor and one capacitor with both the transistor and the capacitor formed in a trench in a substrate. One capacitor plate and the transistor source are common and are formed in the lower portion of the trench sidewall. The transistor drain is formed in the upper portion of the trench sidewall to connect to a bit line on the substrate surface, and the channel is the vertical portion of the trench sidewall between the source and drain. The transistor gate fills the upper portion of the trench, and a heavily doped other plate of the capacitor fills the lower portion of the trench and makes contact with the substrate through the bottom of the trench.

4 Claims, 5 Drawing Sheets

DRAM CELL AND ARRAY

This application is a continuation of application Ser. No. 244,575, filed Sept. 13, 1988, now abandoned, which is a continuation of application Ser. No. 153,546, filed Feb. 9, 1988, now abandoned, which is a continuation of 924,117, filed Oct. 30, 1986, now abandoned, which is a continuation of application Ser. No. 646,663, filed Aug. 31, 1984, now abandoned.

BACKGROUND

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer of from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generates in the substrate by alpha particles (a 5 MeV alpha particle can produce more than 200 femtocoulombs of hazardous electrons), noise injected from the substrate, pn junction leakage over the entire area of the capacitor, and subthreshold leakage of the cell transistor. A typical stored charge in a dRAM cell is 250 fC. For a three volt power supply this requires a storage capacitor of 50 fF; and with a storage oxide thickness of 150 A, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev. Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since electrodes both above and below are separated from the storage region in the recrystallized polysilicon by thin oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor.

Another approach to shrink the area occupied by the cell capacitor is to form the capacitor in a trench. For example, E. Arai, Submircon MOS VLSI Process Technologies, IEEE IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS dRAM, 4 IEEE Elec. Dev. Lett. 411 (1983) all describe a cell with a traditional design except for the capacitor which has been changed from plates parallel to the substrate to plates on the walls of a trench in the substrate. Such a trench capacitor permits large capacitance per area of substrate by simply using a deep trench. The capacitors described in these articles were fabricated as follows: Starting with (100) oriented, p-type, 4-5 ohm-cm resistivity silicon substrates, trench patterns with 0.4-1.0 micron width were formed by electron-beam direct writing. Trenches of 1-3 micron depth were then excavated by reactive ion etching with $CBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorous diffused into the trench surface layers, and the PSG etched away by hydrofluoric acid. $SiO_2$ of 150-500 A was grown in dry $O_2$ or CVD $Si_3N_4$ was deposited 500 A thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area.

A third approach to shrinking dRAM cell size is similar to the second approach described in the preceding paragraph and relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H. Sunami et al, A Corrugated Capacitor Cell (CCC) for Megabit Dynamic MOS Memories, 4 IEEE Elec. Dev. Lett. 90 (1983); and K. Itoh et al, An Experimental 1 Mb DRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with $CCl_4$ gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

The use of trenches for isolation is also well known and has been extensively studied; for example, R. Rung et al, Deep Trench Isolated CMOS Devices, IEEE IEDM Tech Digest 237 (1982); K. Cham et al, A Study of the Trench Inversion Problem in the Trench CMOS Technology, 4 IEEE Elec. Dev. Lett. 303 (1983); A. Hayasaka et al, U-Groove Isolated Technique for High Speed Bipolar VLSI's, IEEE IEDM Tech Digest 62 (1982); H. Goto et al, An Isolation Technology for High Performance Bipolar Memories—IOP-II, IEEE IEDM Tech Digest 58 (1982); T. Yamaguchi et al, High-Speed Latchup-Free 0.5-μm-Channel CMOS Using Self-Aligned TiSi$_2$ and Deep-Trench Isolation Technologies, IEEE IEDM Tech Digest 522 (1983); S. Kohyama et al, Directions in CMOS Technology, IEEE IEDM Tech Digest 151 (1983); and K. Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated capacitors; namely, patterning (typically with oxide mask), RIE with CBrF$_3$, CCl$_4$, Cl$_2$-H$_2$, CCl$_4$-O$_2$, etc. excavation, thermal oxidation (plus LPCVD nitride) of the sidewalls, and filling with polysilicon.

However, the use of trench capacitors fails to fully solve the problems of shrinking dRAM cell size; namely, the cell still occupies a large substrate area for both the horisontally place field effect transistor and a vertically placed trench capacitor.

SUMMARY OF THE INVENTION

The present invention provides a one-transistor dRAM cell structure and memory array in which the cell transistor and capacitor are formed on the sidewalls of a substrate trench at the intersection of a bit line and a word line. This yields a stacking of the cell transistor on top of the cell capacitor and consumes a minimal substrate area.

In preferred embodiments the cell capacitor plates are formed by the doped lower portion of the trench sidewalls and oppositely doped polysilicon filling the trench and extending out of the bottom of the trench to join the substrate. The transistor gate is doped polysilicon filling the upper portion of the trench; the transistor source is the trench sidewall capacitor plate, the drain is a substrate surface diffusion, and the channel is formed in the upper portion of the trench sidewalls.

This stacked arrangement for the transistor and capacitor in a trench solves the problem of the known cell structures of occupying too much substrate area.

DESCRIPTION OF THE PREFERRED EMBODIMENTS

Figure 1A:
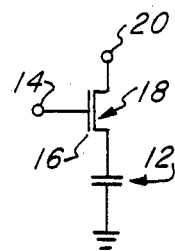
FIGS. 1A–B are the schematic equivalent circuit and local memory array geometry for preferred embodiment dRAM cells.

The preferred embodiment dRAM cells are one transistor/one capacitor cells connected to bit and word lines as shown in schematic FIG. 1A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write. Leakage currents and other sources of decay of the charge on capacitor 12 necessitate periodic refreshing of the charge, and thus the name dynamic RAM (dRAM).

Figure 1B:
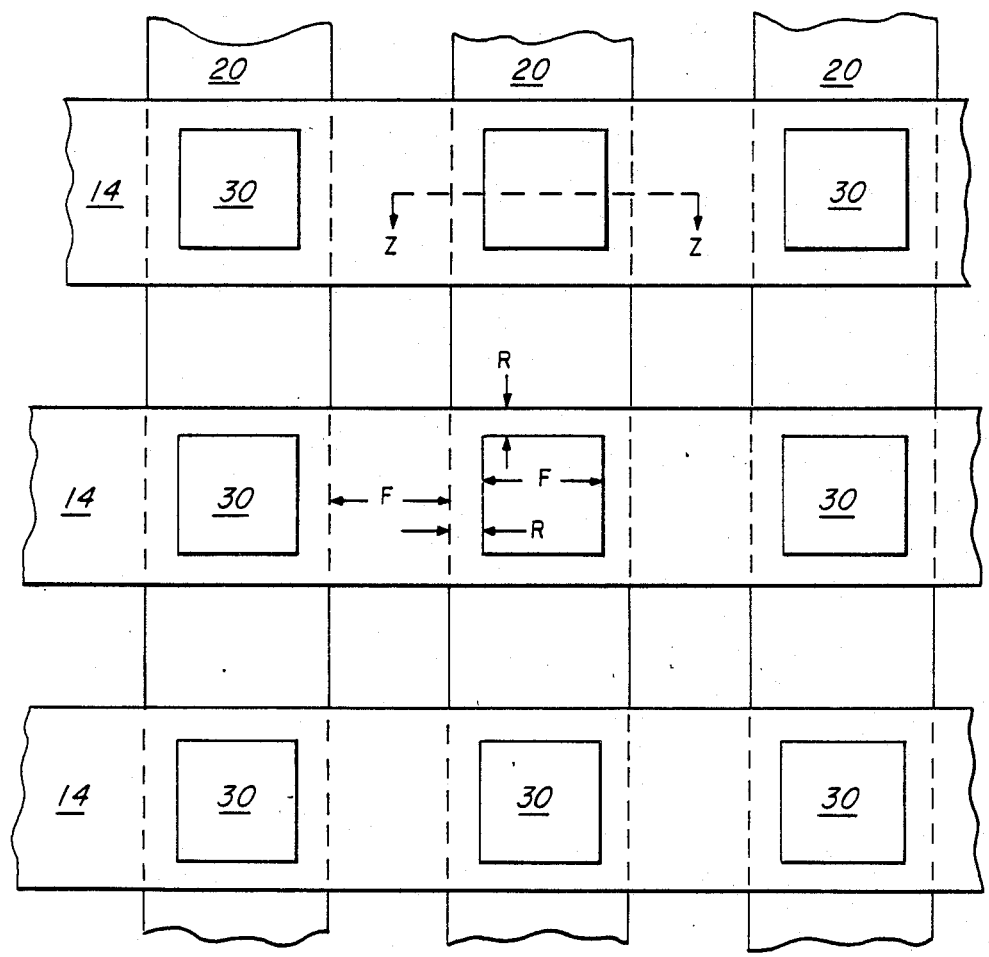

FIG. 1B is a plan view showing a portion of a dRAM array of bit lines 20 and word lines 14 with preferred embodiment cells 30 at the intersections of the lines; note that bit lines 20 pass under word lines 14. The cells extend down into the substrate below the lines and provide a maximal density memory. If the minimum feature size is denoted by f and the minimum registration is denoted by R, then the cell area is $[2(f+R)]^2$. For example, with a minimum feature size of 1.0 micron and a minimum registrationn tolerance of 0.25 micron, the cell area is about 6.25 square microns.

Figure 2:
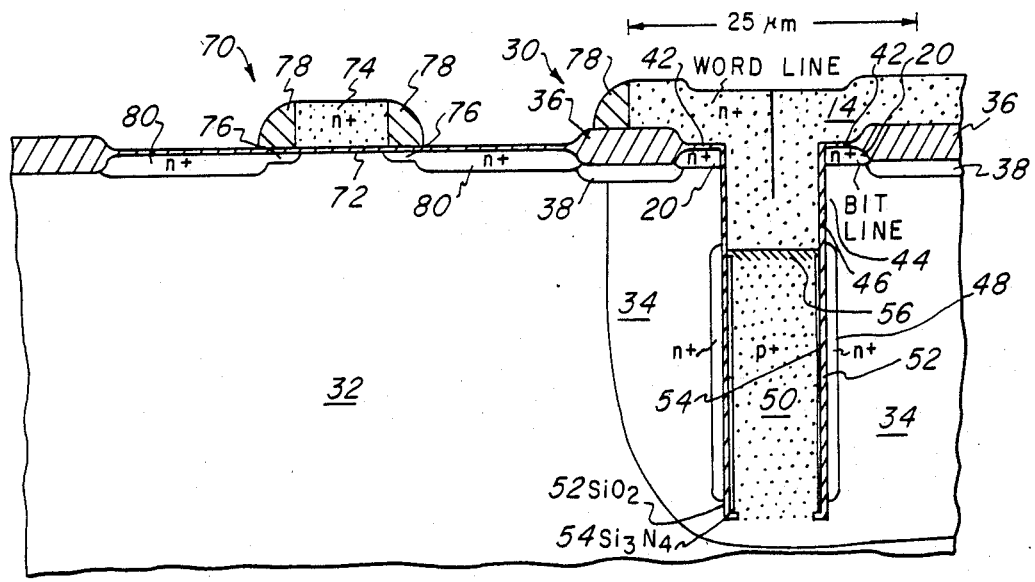
FIG. 2 is a schematic cross sectional elevation of a first preferred embodiment dRAM cell.
Figure 3A:
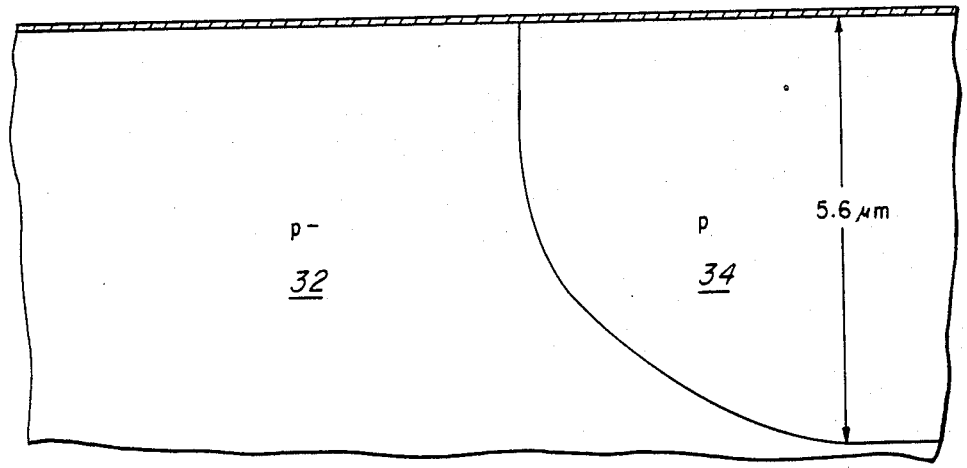
FIGS. 3A–G illustrate a sequence of process steps for fabrication of the first preferred embodiment cell by a first preferred embodiment method.
Figure 3B:
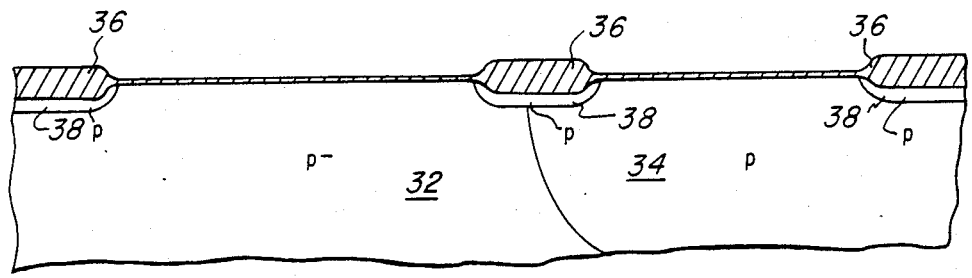
Figure 3C:
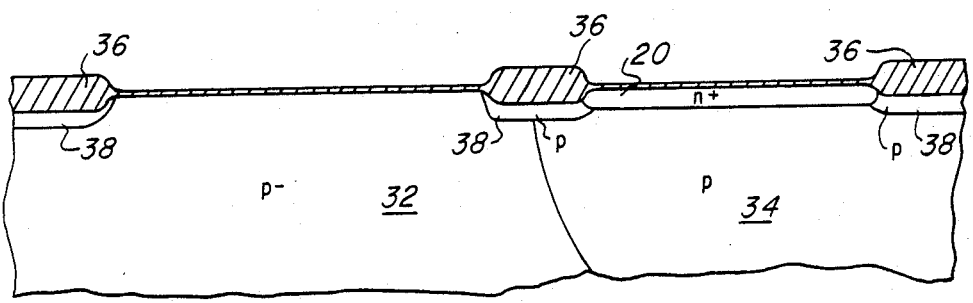
Figure 3D:
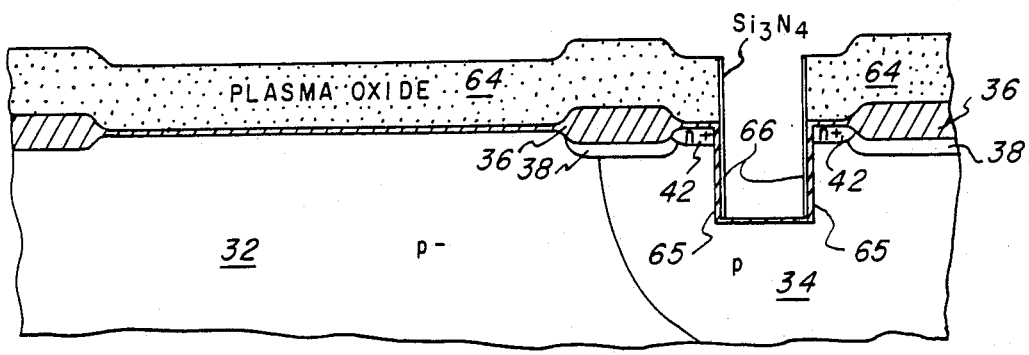
Figure 3E:
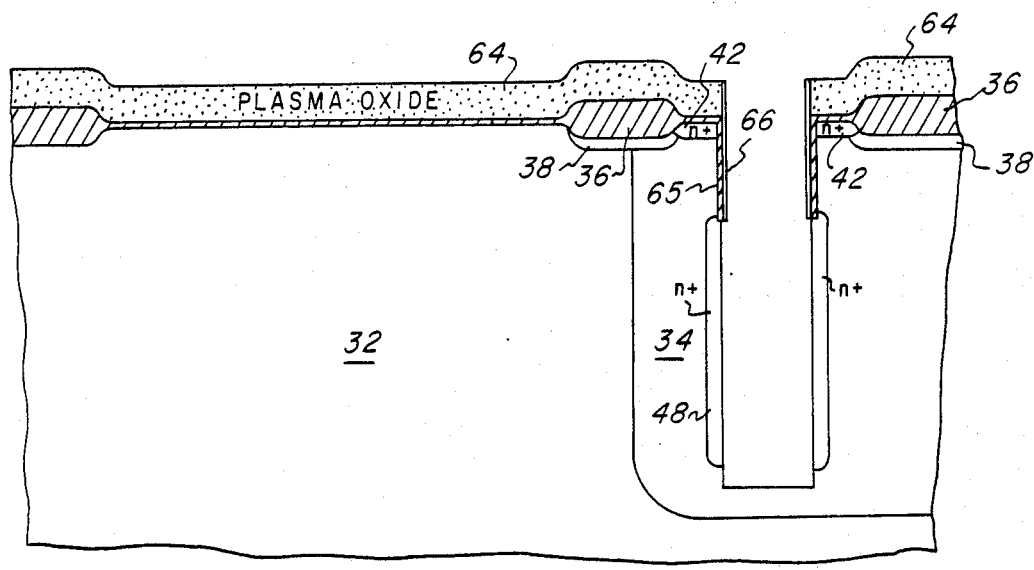
Figure 3F:
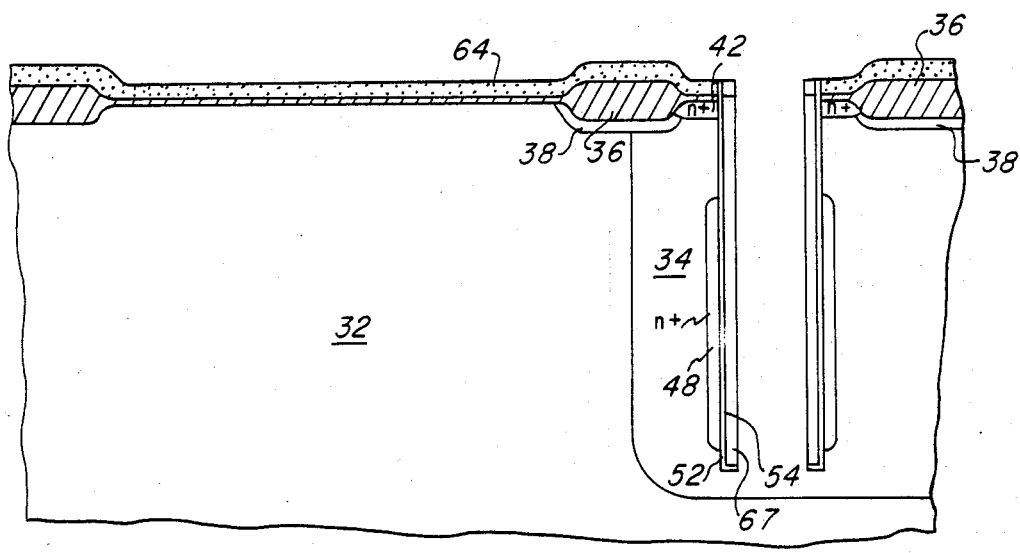
Figure 3G:
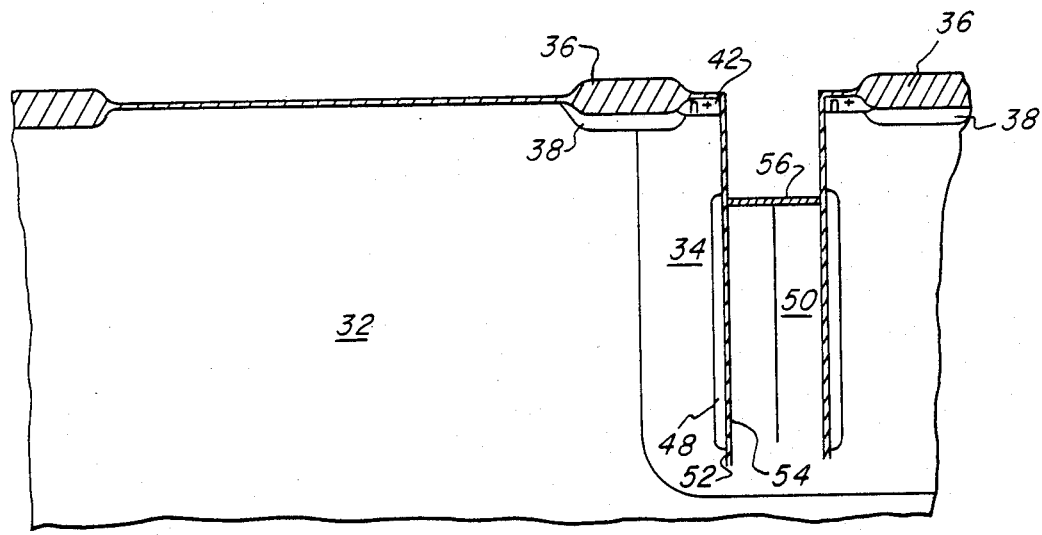

FIG. 2 is a cross sectional view of the first preferred embodiment dRAM cell, generally denoted 30, together with a MOS field effect transistor 70 which may be fabricated simultaneously with cell 30, as described below. Cell 30 is formed in p-silicon substrate 32 with p well 34 and includes field oxide 36, p channel stops 38, n+ buried bit line 20, bit line insulator oxide 42, n+ polysilicon word line 14, transistor 18 channel 44, transistor 18 gate oxide 46, n+ diffused region 48 which forms one of the plates of capacitor 12, p+ polysilicon region 50 which forms the major portion of the other plate of capacitor 12 and connected to substrate ground through the trench bottom, oxide layer 52 and nitride layer 54 which together form the insulator between the plates of capacitor 12, and insulating oxide 56. The view of cell 30 in FIG. 2 corresponds to a section along horizontal line 2—2 in FIG. 1B; the square cross section of the trench containing capacitor 12 and transistor 18 is apparent in FIG. 1B.

In cell 30 capacitor 12 is formed with one of the plates being n+ region 48 and the other plate being p+ region 50 together with p well 34; regions 48 and 50 are separated by the insulator formed of oxide layer 52 and nitride layer 54, whereas region 48 and well 34 form a reversed biased junction. The doping of p well 34 is very low compared to the doping of p+ region 50, so the capacitance of the reversed biased junction is small compared to the capacitance across the insulator provided the insulator is thin. For a trench with a 1 micron by 1 micron cross section and 5 microns deep, the capacitor plate area would be about 16 square microns if the channel region 44 takes up about 1 micron of the trench depth.

Transistor 18 in cell 30 is entirely in bulk silicon with a polysilicon gate: channel region 44 is part of p well 34, source region 48 (which is also a plate of capacitor 12) and drain region 20 (which is also bit line 20) are n+ diffusions in p well 34, gate oxide 46 is grown on the trench surface of p well 34, and the gate is part of polysilicon word line 14. Insulating oxides 42 and 56 are fairly thick, but gate 14 still overlaps the source and drain slightly along the vertical in FIG. 2.

The dimensions and materials characteristics of cell 30 are best understood in connection with the following description of a first preferred embodiment method of fabricating cell 30; FIGS. 3A–G illustrate the sequence of process steps.

1. (100) oriented p-silicon substrate 32 of resistivity 5–10 ohm-cm has p well 34 formed with a carrier concentration of 2E16 per cm$^3$ to a depth of about 6 microns in the active area to be occupied by cells 30; see FIG. 3A.

2. Field oxide 36 and p+ channel stops 38 are formed in the usual manner: a stress relief oxide layer is grown and LPCVD nitride is deposited on the oxide; the active area is patterned and plasma etching removes the nitride and oxide outside the active area; a boron implant using the nitride as a mask creates channel stops 38 to a depth of 4,000 A with a carrier concentration of 1E17 per cm$^3$; and field oxide 36 is grown to a thickness of 8,500 A. The nitride is stripped; see FIG. 3B.

3. Photolithography defines the portion of the active area to be occupied by bit lines 20, and an arsenic implant forms them to a depth of 3,500 A with a carrier concentration of 1E20 per cm$^3$; see FIG. 3C for the view after photoresist cleanup and protective oxide growth.

4. 10,000 A of plasma enhanced CVD oxide 64 is deposited and patterned to define the 1 micron square trenches. The patterned oxide 64 is then used as the mask for RIE with HCl excavation of the trenches to a depth of 1.0 micron. The trench walls are cleaned of RIE damage and contamination with a wet acid etch, and protective oxide 65 thermally grown on the trench walls and bottom; an LPCVD deposition of nitride 66 in a sidewall process is used to protect the sidewall oxide and limit diffusion in subsequent processing; see FIG. 3D.

5. The trench is further excavated again using RIE with HCl, note that oxide 64 is also being somewhat eroded, but was initially deposited sufficiently thick to avoid problems. After the trench has been excavated to a total depth of about 5.0 microns, it is cleaned and a phosphorous vapor phase diffusion used to form n+ region 48 to a thickness of 2,000 A with a carrier concentration of 1E19 per cm$^3$. The bottom of the trench is also doped by this diffusion, so another 0.5 micron of excavation by RIE with HCl is needed to eliminate the doped trench bottom. See FIG. 3E.

6. Capacitor 12 plate insulator is now formed by thermally growing oxide layer 52 to a thickness of 75 A and LPCVD depositing nitriide layer 54 to a thickness of 75 A on oxide 52. Nitride 54 is then thermally oxidized to improve the dielectric integrity and yields a oxide/nitride/oxide stack as the capacitor 12 plate insulator. This stack also covers the bottom of the trench and must be removed without damage to the sidewall stack; so 1,000 A of insitu p+ doped LPCVD polysilicon 67 is deposited, and then the polysilicon and insulator stack at the bottom of the trench are etched away with an anisotropic plasma etch; see FIG. 3F.

7. The trench is filled with in situ p+ doped LPCVD polysilicon 50, polysilicon 67 just becomes a part of polysilicon 50 and polysilicon 50 makes electrical contact with p well 34. Polysilicon 50 is planarized, such as with spun on photoresist, and plasma etched completely away on the surface and down into the trench to slightly below the upper level of region 48. Oxide 64 is now etched, this may also remove a little of field oxide 36, but field oxide 36 was sufficiently thick to avoid problems; and insulating oxide 56 is grown with oxidized nitride 54 on the sidewalls protecting against oxidation along the trench sidewalls. See FIG. 3G.

8. The exposed portion of oxide 52 and oxidized nitride 54 (above insulating oxide 56) is stripped, and gate oxide 46 thermally grown. This stripping also removes the thin oxide on substrate 32 and a little of field oxide 36, so the thermal growth of gate oxide 46 also grows gate oxide 72 for transistor 70. N-doped polysilicon with a carrier concentration of 1E21 per cm$^3$ is deposited by LPCVD and patterned to form word line 14 and transistor gate 74, and a light arsenic implant forms source and drain 76 for transistor 70. Lastly, LPCVD oxide is deposited and plasma etched to leave oxide filaments 78 along the edges of polysilicon 14 and 74, and a heavy arsenic implant forms the source and drain contact regions 80 for transistor 70. See FIG. 2.

Modifications of the preferred embodiment cell or preferred embodiment method of fabrication such as varying the dimensions, the shape of the trenches, doping levels, substitutional materials, diffusions in lieu of implantations, wet instead of dry etching, various halocarbons for RIE, omitting protective nitride 66, and so forth are immediate.

Further, the structure of a trench filled with material electrically connected to the surrounding substrate through the trench bottom can be used in devices other than the preferred embodiment cell 30; such as the trench capacitor of the cells described in the Background.

I claim:

1. A memory cell comprising:
 a substrate having a trench formed therein;
 an insulating layer formed on the sidewalls of said trench;
 a drain region formed in said substrate at the intersection between said trench and the surface of said substrate;
 a doped storage region of opposite conductivity type of said substrate formed in said substrate adjacent to said insulating layer separated from said drain region by a channel region;
 a region of conductive material formed in the bottom of said trench adjacent to said insulating layer, separated from said storage region by said insulating layer, said conductive material being in conductive contact with said substrate at a surface of said trench; and
 a gate formed in said trench adjacent to but insulated from said channel region and vertically disposed above said region of conductive material.

2. A memory cell as in claim 1 wherein said insulating layer comprises a composite dielectric including at least one layer of silicon nitride and at least one layer of silicon dioxide.

3. A memory array comprising:
 a substrate having a plurality of trenches formed therein;
 a plurality of memory cells formed in said trenches, each of said memory cells formed in one of said trenches and each of said cells including:
 an insulating layer formed on the sidewalls of said trench;
 a drain region formed in said substrate at the intersection between said trench and the surface of said substrate;
 a doped storage region of opposite conductivity type of said substrate formed in said substrate adjacent to said insulating layer separated from said drain region by a channel region;
 a region of conductive material formed in the bottom of said trench adjacent to said insulating layer, separated from said storage region by said insulating layer, said conductive material being in conductive contact with said substrate at a surface of said trench; and
 a gate formed in said trench adjacent to but insulated from said channel region and vertically disposed above said region of conductive material.

4. A memory array as in claim 3 wherein said insulating layer comprises a composite dielectric including at least one layer of silicon nitride and at least one layer of silicon dioxide.

* * * * *